(12) United States Patent
Dörrich et al.

(10) Patent No.: US 7,466,549 B2
(45) Date of Patent: Dec. 16, 2008

(54) COOLING ARRANGEMENT FOR SERVER BLADES

(75) Inventors: Martin Dörrich, Sinn (DE); Michael Nicolai, Rabenau (DE)

(73) Assignee: Rittal GmbH & Co. KG, Herborn (DE)

( * ) Notice: Subject to any disclaimer, the term of this patent is extended or adjusted under 35 U.S.C. 154(b) by 233 days.

(21) Appl. No.: 10/576,425

(22) PCT Filed: Nov. 20, 2004

(86) PCT No.: PCT/EP2004/013199

§ 371 (c)(1),
(2), (4) Date: Apr. 20, 2006

(87) PCT Pub. No.: WO2005/081604

PCT Pub. Date: Sep. 1, 2005

(65) Prior Publication Data

US 2007/0121287 A1    May 31, 2007

(30) Foreign Application Priority Data

Feb. 17, 2004   (DE) ...................... 10 2004 008 461

(51) Int. Cl.
*H05K 7/20* (2006.01)
*F28F 7/00* (2006.01)

(52) U.S. Cl. ............................ 361/699; 62/64; 165/80.4

(58) Field of Classification Search ................. 361/699; 257/714; 174/15.1, 252; 165/80.4–80.5; 62/259.2
See application file for complete search history.

(56) References Cited

U.S. PATENT DOCUMENTS 5,457,603 A * 10/1995 Leeb ........................... 361/698

| | | | |
|---|---|---|---|
| 6,621,707 B2 * | 9/2003 | Ishimine et al. ............. 361/721 |
| 7,057,893 B2 | 6/2006 | Nicolai et al. | |
| 7,257,000 B2 * | 8/2007 | Pfahnl et al. ................. 361/700 |
| 7,342,789 B2 * | 3/2008 | Hall et al. .................... 361/701 |
| 2002/0007641 A1 | 1/2002 | Marsala | |
| 2002/0021557 A1 | 2/2002 | Ishimine et al. | |
| 2004/0050231 A1 * | 3/2004 | Chu et al. ...................... 83/574 |
| 2004/0057211 A1 * | 3/2004 | Kondo et al. ................ 361/696 |

(Continued)

FOREIGN PATENT DOCUMENTS

DE    80 28 580.9    4/1981

(Continued)

*Primary Examiner*—Jayprakash N Gandhi
*Assistant Examiner*—Zachary M Pape
(74) *Attorney, Agent, or Firm*—Pauley Petersen & Erickson

(57) ABSTRACT

A housing arrangement including a receiving housing with an interior inside which a cooling device and one or several electric units are accommodated. The cooling device includes a flow line and a return line extending at least partially between the base area and ceiling area of the receiving housing. Connecting lines run from the flow line and the return line and are physically connected to a cooling circuit of one or several electric units. Effective cooling of receiving areas which are fitted in a complex manner with built-in components is obtained because a distributor line is respectively guided from a flow line and a return line to a distributor which is maintained inside the receiving housing. The distributor includes several distributor connections that can be connected to connection lines which are guided to the electric built-in component, such as a computer unit.

10 Claims, 2 Drawing Sheets

U.S. PATENT DOCUMENTS

2005/0133214 A1 * 6/2005 Pfahnl .................. 165/185

FOREIGN PATENT DOCUMENTS

| DE | 37 19 127 A1 | 12/1987 |
| --- | --- | --- |
| DE | 90 03 687.5 | 7/1990 |
| DE | 43 27 444 A1 | 2/1995 |
| DE | 101 12 389 A1 | 10/2002 |
| DE | 102 10 480 A1 | 10/2003 |
| DE | 102 10 480 B4 | 7/2005 |
| EP | 0 767 601 A | 4/1997 |
| FR | 2 607 349 | 5/1988 |
| JP | 01286397 | * 11/1989 |
| JP | 2002374086 A | 12/2002 |
| WO | 03/077625 A | 9/2003 |

* cited by examiner

COOLING ARRANGEMENT FOR SERVER BLADES

BACKGROUND OF THE INVENTION

1. Field of the Invention

This invention relates to a housing arrangement with a receiver housing, an interior in which a cooling arrangement and one or several electrical units are housed, wherein the cooling arrangement has a feed line and a return line extending at least in parts between a bottom area and a ceiling area of the receiver housing, wherein connecting lines branch off the feed line and the return line and lead to at least one distributor arranged between the electrical units, and to distributor connectors connecting lines to the electrical units can be connected.

2. Discussion of Related Art

A housing arrangement is taught by U.S. Patent Publication 2002/0021557 A1. Here, a confused and hard to access conduct of the lines results from the conduct of the feed and return lines to the cooling arrangement, and of the connecting line to the distributor, as well as from the installed arrangement of the distributor and the electrical units, which greatly hinders the installation and expansion possibilities.

SUMMARY OF THE INVENTION

It is one object of this invention to simplify and overcome disadvantages in a housing arrangement of this type by a new conduct of the lines and arrangement of the elements so that the maintenance and assembly possibilities are made easier by improving the accessibility.

In accordance with this invention, this object is achieved if the distributor is maintained in the front area of the receiver housing and the connecting lines are accessible via an opening with a door in the front of the receiver housing. The feed and return lines embodied as risers are arranged in the rear area of the receiver housing, and the distributor lines extend between the distributor and the risers in the direction toward the housing interior.

In this way the lines are relocated to the rear and the front of the receiver housing and are easily accessible. Thus, the front opening closed by a door permits access to the distributor and its connecting lines, so that the connecting lines to the electrical units can be comfortably changed. This is a particular advantage in the case of maintenance and expansion.

If the distributor lines are placed with a descending gradient between the distributor and the feed or return line, wherein the distributor lines rise in a direction toward the feed or return lines, the distributor lines can be ventilated in a simple manner via the feed line and return line.

An arrangement is also particularly advantageous if at least a part of the electrical units which are coupled to the distributor is arranged underneath the distributor in a direction of the force of gravity. In that case, the cooling circuit can be vented via the distributor lines.

If the distributor is embodied as a hollow profiled section with two chambers assigned to the feed line and the return line, or the distributor has two separate hollow profiled sections, which are assigned to the feed line and return line, then stable connection possibilities for the connecting lines are created in a simple manner. Also, the distributors are simpler to build in and mount. Furthermore, the danger of leakage is low with such distributors.

In one application of this invention, the electrical unit is designed as a computer unit, particularly one inserted by power blades, which is installed together with other computer units in a server, particularly a blade server. Blade servers are particularly distinguished by a large power dissipation. This invention makes it possible to effectively bleed this off, to achieve a satisfactory utilization of space of the interior of the receiver housing.

In order to install the cooling device individually with a little cost outlay, the connecting lines can be attached to the distributor connectors by dripless connectable and disconnectable couplings and/or the distributor lines can be attached to the feed lines and return lines by dripless connectable and disconnectable couplings.

BRIEF DESCRIPTION OF THE DRAWINGS

This invention is explained in greater detail in view of an exemplary embodiment represented in the drawings, wherein.

DETAILED DESCRIPTION OF THE INVENTION

Figure 1:
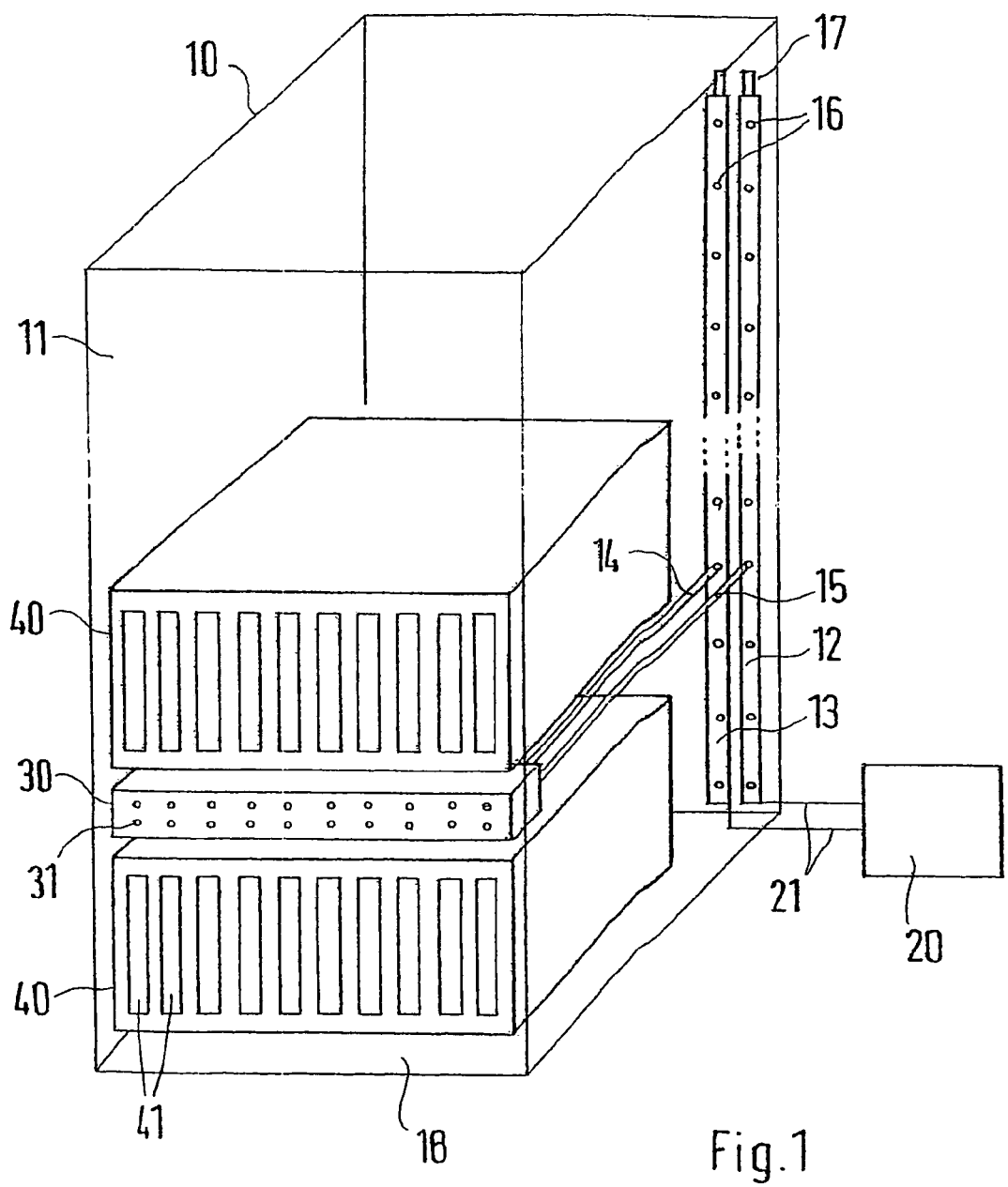
FIG. 1 shows a receiver housing with electrical units and a cooling arrangement, in a schematic representation.

A receiver housing 10, which surrounds an interior 11, is shown in FIG. 1. Such receiver housings 10 are usually designed as switchgear cabinets having a rack. The rack is covered on all sides and is closed by a hinged door at the front 18. Built-ins are fastened to the rack in the interior 11. In the present case, servers 40, in particular blade servers, are maintained in the interior and have receptacles, in which the vertically oriented computer units 41, or power blade inserts, can be seated. A distributor 30 is arranged between the servers 40 and designed as a hollow profiled section with two chambers extending in longitudinal directions. The distributor 30, the same as the server 40, is accessible through the opened front 18 of the receiving housing 10. The distributor 30 can also be fastened on the rack and bridges the front 18 completely or partially.

The distributor 30 has distributor connectors 31, which are arranged in a graduated grid, spaced apart from each other. These are connected with the conduits formed by the distributor 30.

Figure 2:
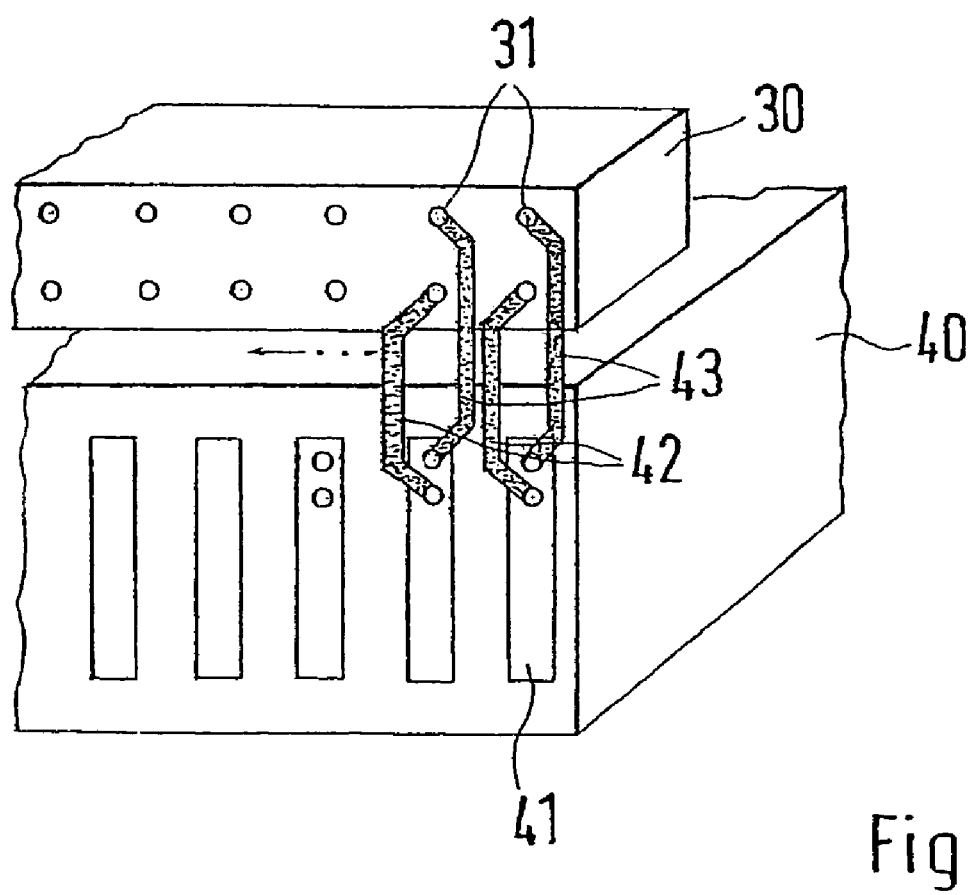
FIG. 2 shows a detailed view of a portion of the receiver housing shown in FIG. 1.

As FIG. 2 shows, connecting lines 42, 43 can be connected to the distributor connectors 31 by couplings, which can be connected and disconnected in a dripless manner. The connecting lines 42, 43 are conducted in pairs to respective computer units 41 and are connected there, also in a dripless connectable and disconnectable manner, to a cooling circuit on the inside of the computer.

As FIG. 1 further shows, the distributor 30 is connected via two distributor lines 14, 15 to two risers which are used as feed and return lines 12 and 13. They are arranged in the area of or near the rear of the switchgear cabinet, are embodied as rigid hollow profiled sections, and have connecting points, which are arranged spaced apart from each other in a graduated grid and to which the distributor lines 14, 15 are connected via couplings which can be connected and disconnected in a dripless manner.

The feed and return lines 12 and 13 can be connected to a cooling arrangement 20 placed outside the receiver housing 10 by connecting lines 21 on their bottoms. The feed and return lines 12 and 13 have vents 17 in the roof area of the receiver housing 10. The cooling system can be vented through the vents 17.

During cooling operations the cooling arrangement 20 provides a cooling medium, which is conveyed to the feed line 12 through one of the two connecting lines 21. From there the cooling medium reaches the cooling system of the respective computer unit 41 via the associated distributor line 14 and the connecting line 43. It is heated there and is again returned to the cooling arrangement 20 via the connecting line 42, the distributor 30, the distributor line 15 and the return line 13. There it is cooled and fed in again.

The invention claimed is:

1. A housing arrangement with a receiver housing and an interior in which a cooling arrangement and one or several electrical units are housed, wherein the cooling arrangement has a feed line and a return line extending at least in parts between a bottom area and a ceiling area of the receiver housing, and connecting lines branch off the feed line and the return line and lead to at least one distributor arranged between the electrical units and having distributor connectors to which connecting lines with the electrical units can be connected, the housing arrangement comprising:

the distributor (30) maintained in a front area (18) of the receiver housing (10) and the connecting lines (42, 43) accessible through an opening with a door in the front area of the receiver housing (10), the feed line (12) and the return line (13) formed as risers and arranged in a rear area of the receiver housing (10), and the distributor lines (14, 15) extending between the distributor (30) and the risers in a direction toward the housing interior.

2. The housing arrangement in accordance with claim 1, wherein the distributor lines (14, 15) are positioned with a descending gradient between the distributor (30) and one of the feed line (12) and the return line (13), wherein the distributor lines (14, 15) rise toward one of the feed line and the return line.

3. The housing arrangement in accordance with claim 2, wherein at least a part of the electrical units which are coupled to the distributor (30) is arranged below the distributor (30) in a direction of a force of gravity.

4. The housing arrangement in accordance with claim 3, wherein the distributor (30) has a hollow profiled section with two chambers assigned to the feed line (12) and the return line (13), or the distributor (30) has two separate hollow profiled sections assigned to the feed line (12) and the return line (13).

5. The housing arrangement in accordance with claim 4, wherein the electrical unit is a computer unit including power blades, which is installed together with other computer units in a blade server.

6. The housing arrangement in accordance with claim 5, wherein at least one of the connecting lines (42, 43) are attachable to distributor connectors (31) by dripless connectable and disconnectable couplings, or the distributor lines (14, 15) are attachable to the feed line (12) and the return line (13) by dripless connectable and disconnectable couplings.

7. The housing arrangement in accordance with claim 1, wherein at least a part of the electrical units which are coupled to the distributor (30) is arranged below the distributor (30) in a direction of a force of gravity.

8. The housing arrangement in accordance with claim 1, wherein the distributor (30) has a hollow profiled section with two chambers assigned to the feed line (12) and the return line (13), or the distributor (30) has two separate hollow profiled sections assigned to the feed line (12) and the return line (13).

9. The housing arrangement in accordance with claim 1, wherein the electrical unit is a computer unit including power blades, which is installed together with other computer units in a blade server.

10. The housing arrangement in accordance with claim 1, wherein at least one of the connecting lines (42, 43) are attachable to distributor connectors (31) by dripless connectable and disconnectable couplings, or the distributor lines (14, 15) are attachable to the feed line (12) and the return line (13) by dripless connectable and disconnectable couplings.

* * * * *